United States Patent
Kasai et al.

(10) Patent No.: US 9,768,872 B2
(45) Date of Patent: Sep. 19, 2017

(54) OPTICAL TRANSCEIVER OUTPUTTING WAVELENGTH MULTIPLEXED SIGNAL AND RECEIVING ANOTHER WAVELENGTH MULTIPLEXED SIGNAL

(71) Applicant: SUMITOMO ELECTRIC INDUSTRIES, LTD., Osaka-shi, Osaka (JP)

(72) Inventors: Shinta Kasai, Yokohama (JP); Fumihiro Nakajima, Yokohama (JP); Masaaki Ono, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/940,891

(22) Filed: Nov. 13, 2015

(65) Prior Publication Data

US 2016/0149643 A1    May 26, 2016

(30) Foreign Application Priority Data

Nov. 20, 2014   (JP) .................. 2014-235178
Nov. 20, 2014   (JP) .................. 2014-235905

(51) Int. Cl.
| | |
|---|---|
| H04B 10/40 | (2013.01) |
| G02B 6/00 | (2006.01) |
| H03H 1/02 | (2006.01) |
| H04J 14/02 | (2006.01) |
| H05K 1/02 | (2006.01) |

(52) U.S. Cl.
CPC .............. *H04B 10/40* (2013.01); *G02B 6/00* (2013.01); *H04J 14/0256* (2013.01); *H03H 1/02* (2013.01); *H05K 1/0218* (2013.01); *H05K 2201/09781* (2013.01)

(58) Field of Classification Search
USPC ........................................... 398/79
See application file for complete search history.

(56) References Cited

U.S. PATENT DOCUMENTS

| 7,171,128 | B2 | 1/2007 | Hasegawa et al. | |
|---|---|---|---|---|
| 2002/0097962 | A1* | 7/2002 | Yoshimura | G02B 6/10 385/50 |
| 2004/0164819 | A1* | 8/2004 | Mishima | H01G 4/33 333/174 |
| 2004/0188793 | A1* | 9/2004 | Lindemann | H01L 27/1463 257/457 |

(Continued)

FOREIGN PATENT DOCUMENTS

| JP | H07-22642 A | 1/1995 |
|---|---|---|
| JP | 2003-134051 A | 5/2003 |
| JP | 2006-270616 A | 10/2006 |

*Primary Examiner* — David Payne
*Assistant Examiner* — Omar S Ismail
(74) *Attorney, Agent, or Firm* — Global IP Counselors, LLP

(57) ABSTRACT

An optical transceiver that provides a receiver optical module including a plurality photodiodes (PDs) each biased through internal bias lines, signal lines carrying driving signals to an optical transmitter module, and external bias lines each connected to the internal bias lines. One of the internal bias lines connected to one of the external bias lines arranged closest to the signal lines has a length shorter than lengths of the other internal bias lines so as not to affect EMI noises induced from the signal lines to the other internal bias lines.

10 Claims, 6 Drawing Sheets

(56) References Cited

U.S. PATENT DOCUMENTS

| | | | |
|---|---|---|---|
| 2010/0020469 A1* | 1/2010 | Kurioka | H01G 4/018 361/321.1 |
| 2011/0217045 A1* | 9/2011 | Watson | G02B 6/12002 398/79 |
| 2013/0000956 A1* | 1/2013 | Ishida | H01L 23/66 174/251 |

* cited by examiner

OPTICAL TRANSCEIVER OUTPUTTING WAVELENGTH MULTIPLEXED SIGNAL AND RECEIVING ANOTHER WAVELENGTH MULTIPLEXED SIGNAL

CROSS-REFERENCE TO RELATED APPLICATIONS

This application claims priority under 35 U.S.C. §119(a) to Japanese Patent Application No. 2014-235905, filed in Japan on Nov. 20, 2014, and to Japanese Patent Application No. 2014-235178, filed in Japan on Nov. 20, 2014. The entire contents of Japanese Patent Application No. 2014-235905 and Japanese Patent Application No. 2014-235178 are hereby incorporated herein by reference in their entirety.

BACKGROUND

1. Field of the Invention

The present application relates to an optical transceiver that transmits and receives wavelength multiplexed signals.

2. Background Arts

In order to eliminate noises superposed on power supply lines and/or bias lines, a technique to insert capacitors between the power supply lines, the bias lines and the ground has been well known in the circuit engineering. Many prior arts have disclosed such a technique.

Recently, a new type of an optical transceiver becomes popular to solve a subject regarding to the communication capacity between servers. Such an optical transceiver has a transmission speed of exceeding 10 Gbps, sometimes reaching 40 Gbps and 100 Gbps and densely assembles many optical and electrical components therein. In such a high density assembly, the signal lines for an optical transmitter, which switch large currents, and the signal lines for an optical receiver, which carry signals with faint amplitude, are closely disposed. Thus, the signal line for the optical transmitter may cause an EMI noise source against the signal line for the optical receiver, which degrades the sensitivity of the optical receiver. In particular, an optical transceiver that implements with plural channels, namely, a plural photodiodes to sense optical signals is necessary to consider the EMI noises affected to respective PDs or arrangements around the respective PDs to maintain the sensitivity of the optical receiver.

SUMMARY OF THE INVENTION

One aspect of the present application relaters to an optical transceiver that transmits a wavelength multiplexed optical signal and receives another wavelength multiplexed optical signal. The optical transceiver comprises an optical transmitter module, an optical receiver module, and a bias source. The optical transmitter module receives driving signals through signal lines, converts the driving signals into transmitting optical signals having respective wavelengths different from each other, and generates the wavelength multiplexed optical signal by multiplexing the transmitting optical signals depending on the wavelengths thereof. The optical receiver module de-multiplexes the other wavelength multiplexed signal into receiving optical signals, and converts the receiving optical signals into receiving signals by photodiodes (PDs). The bias supply supplies biases to respective PDs through external bias lines including first external bias line and other external bias lines. The first external bias line is arranged closest to the signal lines that carry the driving signals to the optical transmitter module.

The optical receiver module provides internal bias lines that include a first internal bias line connected to the first external bias line through a first terminal and other internal bias lines each connected to the external bias lines through terminals. The first internal bias line includes a first filter unit having a resistor and a capacitor which constitute a first RC filter. The other internal bias lines include other filter units each having a resistor and a capacitor constituting RC filters. A feature of the present optical receiver module is that the first internal bias line has a length from the first terminal to the resistor in the first filter unit shorter than lengths of the other internal bias lines from the respective terminals to the resistors in the other filter units.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments according to the present application will be described as referring to accompanying drawings. In the description of the drawings, numerals or symbols same with or similar to each other will refer to elements same with or similar to each other without duplicating explanations.

First Embodiment

Figure 1:
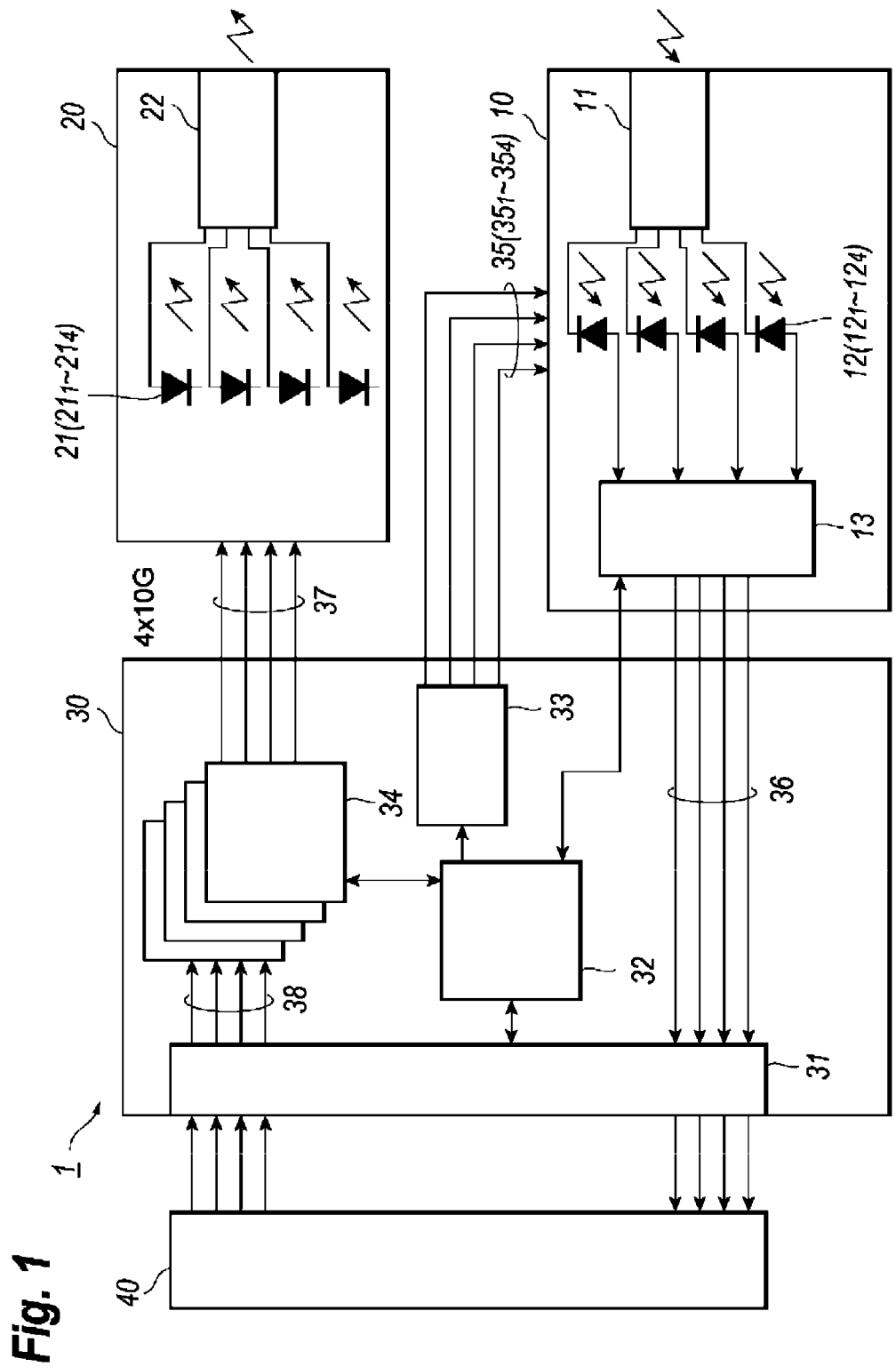
FIG. 1 is a functional block diagram of an optical transceiver according to an embodiment of the present applications.

FIG. 1 shows a functional block diagram of an optical transceiver according to an embodiment of the present application. The optical transceiver 1, which is a type of a pluggable optical transceiver plugged with a host system, shows transmission capacity of 40 Gbps by wavelength multiplexing four (4) optical signals having respective wavelengths different from each other in a range of 1.3 μm. The description below concentrates on an optical transceiver of 40 Gbps, but the same description may be applicable to another type of an optical transceiver having, for instance, 100 Gbps transmission speed. Specifications including outer dimensions and electrical interfaces are defined by a multi-source agreements (MSAs) called as QSFP+ (Quad Small From factor Pluggable) or CFP (Centum Form factor Pluggable).

The optical transceiver 1 includes an optical receiver module (hereinafter denoted as Rx module) 10, an optical transmitter module (hereinafter denoted as Tx module) 20, and a printed circuit board (hereinafter denoted as PCB) 30. The Rx module 10 and the Tx module 20 are enclosed within the optical transceiver 1 accompanied with signal lines, 36 and 37, that supply driving signals to the Tx module and extract electrical signals from the Rx module 10. The Rx module 10 outputs four electrical signals by converting four optical signals having wavelengths different from each other and transmission speeds of 10 Gbps into the electrical signals. The electrical signals thus output from the Rx module 10 are provided to the host system 40 after extracting a clock from four data by a clock data recovery (CDR), which is not explicitly illustrated in the figures.

The Rx module 10 includes an optical de-multiplexer 11, four photodiodes (PDs) 12, and four trans-impedance amplifier (TIA) 13. The optical de-multiplexer 11, which may include a plurality of wavelength filters or an arrayed waveguide, de-multiplexes the wavelength multiplexed optical signal into four signals each having wavelengths of $\lambda_1$ to $\lambda_4$. The PDs 12, by being supplied with biases from a bias supply 33, generate photocurrents corresponding to the received optical signals. The PDs 12 includes four PDs 12$n$, where n=1 to 4, each receiving the de-multiplexed signals attributed to the wavelengths of $\lambda$n. In the description below, a subscription of "n" means the signal channels attributed to the optical transceiver 1. That is, the optical transceiver 1 of the present embodiment provides four signal channels and the subscription n takes 1 to 4, namely, n=1 to 4. The TIA 13 converts the photocurrents provided from the PDs, 12$_1$ to 12$_4$, into voltage signals and amplifies thus converted voltage signals. The TIA 13 may integrate four respective TIAs in one integrated circuit (IC).

The Tx module 20 converts four electrical signals, each having transmission speeds of 10 Gbps, into four optical signals attributed to respective wavelengths different from each other, multiplexes thus converted optical signals, and outputs the multiplexed optical signal. The Tx module 20 includes four laser diodes (LDs) 21$n$, which may be collectively called as an LD 21, and an optical multiplexer 22.

The LD 21 is a light-emitting device driven by electrical signals provided from the LD-driver 34 through the signal lines 37, which collectively includes four (4) lines corresponding to the respective LDs, 21$_1$ to 21$_4$. The LD 21 includes four LDs 21$n$, which may be integrally formed, each outputting optical signals attributed to wavelengths different from each other to the optical multiplexer 22. The optical multiplexer 22 may multiplex the four optical signals provided from the LDs 21$n$ into one multiplexed signal.

The PCB 30 mounts a connector 31, a controller 32, the bias supply 33, and the LD-driver 34 thereon. The connector 31, which is provided in an edge of the PCB 30 and has a type of the edge-connector, is plugged with a socket prepared in the host system 40. The connector 30 mated with the socket may turn on the optical transceiver 1 by providing the power to the optical transceiver 1 and secure the communication to the host system 40.

The controller 32, which may communicate with the host system 40 through the connector 31, controls the respective units implemented within the optical transceiver 1. The controller 32 may transmit and receive data to and from the host system by, what is called, the serial communication. Also, the controller 32 may suspend respective LDs 21$n$ by providing a command to the LD-driver 34. When some failures are detected within the optical transceiver 1, the controller 32 sends an alarm to the host system 40, and manages the respective units within the optical transceiver 1 following the commands provided from the host system 40. The controller 32 may be a one-chip micro-controller, a field programmable gate-array (FPG), a complex programmable device (CPD), and so on, or combinations of those devices. The controller 32 may communicate with the Rx module 10 and the Tx module 20 to monitor the operating conditions thereof and to manage the operations thereof.

The bias supply 32 provides biases to the PD 12 under the control of the controller 32. The biases are provided to the PD 12 through the external bias lines 35 that includes four independent lines 35$n$ each providing respective biases to the PDs 12$n$.

The LD-driver 34 drives the respective LDs 21$n$ under the management of the controller 32. The driving signals output from the LD-driver 34 are provided to the LDs 21$n$ through the Tx signal lines 37. The LD-driver 34 may be an IC including four independent drivers each driving the LDs 21$n$ connected thereto. The LDs 21$n$ sometimes require biases which may be provided from a bias unit independently mounted on the PCB 30 or provided from the LD-driver 34 superposed on the driving signals.

In the optical transceiver 1, the Tx signal lines 37 from the driver 34 to the LDs 21$n$ are arranged close to the external bias lines 35$n$ from the bias source 33 to the PDs 12$n$ because the optical transceiver 1 implements with a plural PDs 12$n$ and a plural LDs 21$n$ within a compact housing. When a transmission line that carries a large switching current is arranged close to a signal reception line that carries a faint signal, the switching of the large current inevitably causes an electro-magnetic interference (EMI) noises to the faint signal. In the present embodiment, the external bias lines 35$n$ are probably affected by the switching current carried on the Tx signal lines 37. In particular, when the four external bias lines 35$n$ are arranged closer to the signal lines 37 in this order in the optical transceiver 1, the first external bias line 35$_1$ arranged nearest to the signal lines 37 is most likely influenced by the switching of the driving signal. Next, details of the arrangement in the Rx module 10 relating to the elimination of the EMI noise will be described.

Figure 2:
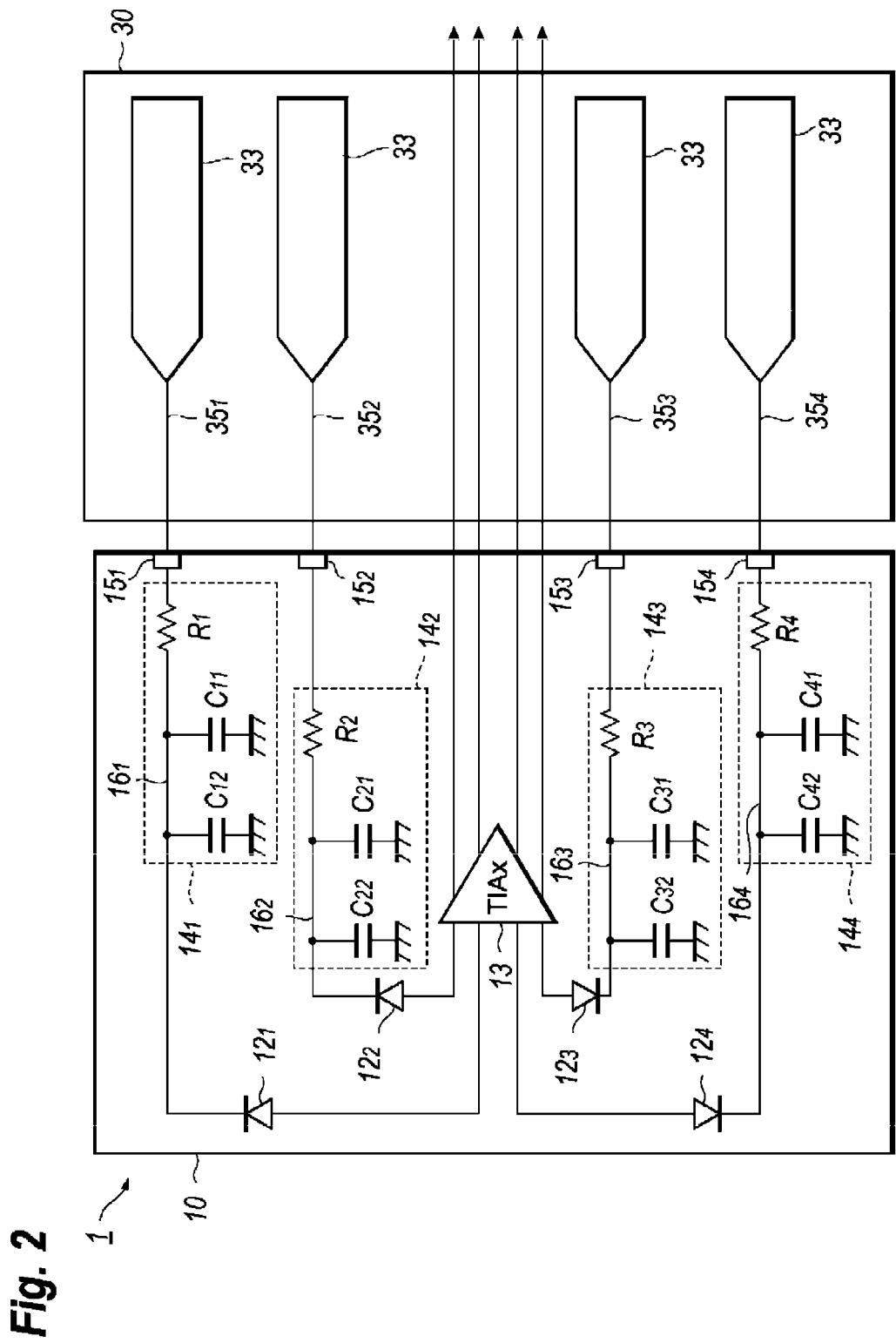
FIG. 2 is a circuit diagram of an optical receiver implemented within the optical transceiver according to the first embodiment.

FIG. 2 schematically shows a circuit diagram of the Rx module 10 and the PCB 30 in the optical transceiver 1 shown in FIG. 1. FIG. 2 omits the arrangements around the optical de-multiplexer 11. The Rx module 10 includes, corresponding to respective signals channels, four filter units 14$n$ four input terminals 15$n$ and four internal bias lines 16$n$. The TIA 13, as described above, receives the photocurrents from the PDs 12$n$ converts the photocurrents into voltage signals, and outputs thus converted voltage signals. The voltage signals output from the TIA 13 may be a single-ended type or a differential type.

The internal bias lines 16$n$, each extend from the terminals 15$n$ to the respective PDs 12$n$. The filter units 14$n$, which are interposed on the respective bias lines 16$n$ each includes capacitors, Cn1 and Cn2, and a resistor Rn. In the respective filter units 14$n$, two capacitors, Cn1 and Cn2, are connected in parallel between the resistor Rn and the ground, while, the resistor Rn is put between the capacitors, Cn1 and Cn2, and the terminals 15$n$. In the respective filter units 14$n$, the former capacitors Cn1 are selected primarily by a reason of having relatively larger capacitance, while, the latter capacitors Cn2 are selected primarily by another reason of having relatively better high frequency performance. That is, the former capacitors Cn1 have a type of the chip capacitor and the latter capacitors Cn2 have a type of the die capacitor. For instance, the latter capacitors Cn2 have capacitance of several scores to several hundreds of picofarads, and arranged immediate to the PDs 12$n$, namely, closer to the PDs 12$n$ compared with the former capacitors Cn1. The latter capacitors Cn2 may effectively eliminate noises corresponding to the transmission speed of 100 Gbps. The former capacitors Cn1 may have capacitance by which the noises having frequencies from several mega-hertz to several scores of mega-hertz are eliminated.

In an example, a frame in the SDH/SONET standard iterates a pattern of 11110110b, where "b" in the end means that the pattern is denoted in binary, by 192 bytes, and another pattern of 00101000b by 192 bytes in the overhead thereof, which causes noises containing several mega-hertz. The RC filters formed by the resistors Rn and the capacitors Cn2 may effectively eliminate those frequency components from the bias lines $16n$ when the resistors Rn have resistance of 100 and the former capacitors Cn1 have capacitance by which noises having frequency components of several mega-hertz may effectively eliminated. When the Rx module 10 includes only one PD; an RC filter formed by a resistor and a capacitor may be arranged immediate to the PD, specifically, immediate close to the cathode of the PD. However, when an Rx module implements with multiple PDs like the preset embodiment, the arrangements of the capacitors, Cn1 and Cn2, and the resistors Rn depend on the positions of the PDs $12n$.

In the present Rx module 10, a length of the first bias line $16_1$ from the terminal $15_1$ to the resistor $R_1$ is shorter than lengths of the other bias lines, $16_2$ to $16_4$, from the respective terminals, $15_2$ to $15_4$, to the resistors, $R_2$ to $R_4$. Next, the arrangements of the internal bias lines $16n$ in the Rx module 10 of the present embodiment will be described as referring to FIG. 3, which is a plan view of the arrangement around the PDs $12n$ in the Rx module 10 of the embodiment.

Figure 3:
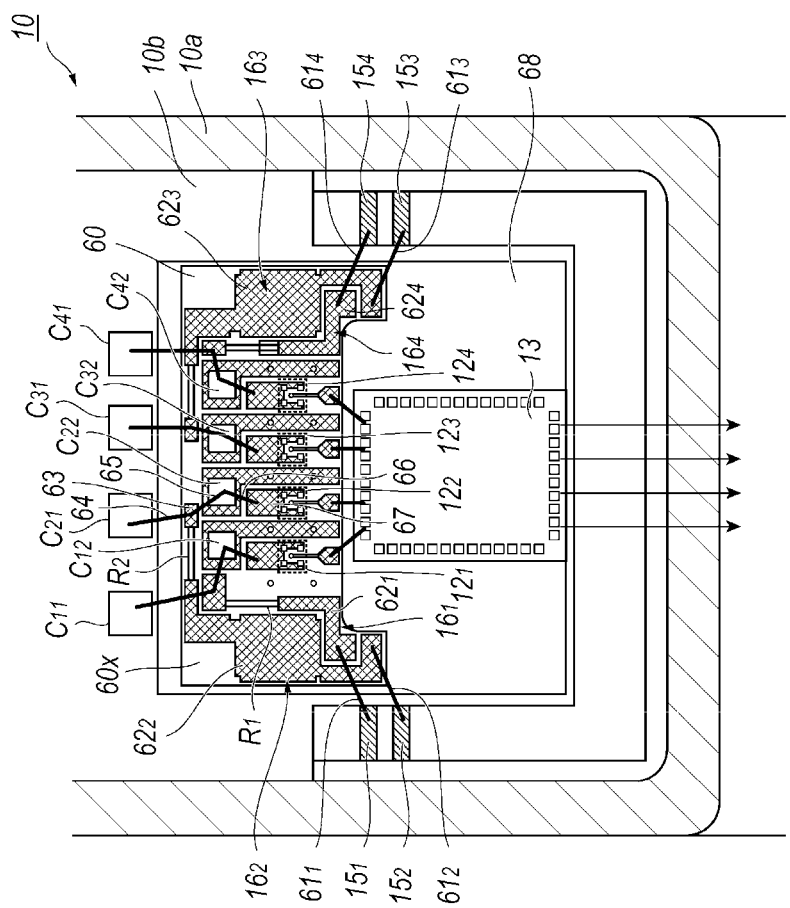
FIG. 3 is a plan view of a receiver optical module whose circuit diagram is shown in FIG. 2.

As illustrated in FIG. 3, the Rx module 10 of the present embodiment arranges a carrier 68 on the bottom $10b$ of the housing $10a$. The carrier 68 mounts the wiring substrate 60 on which four PDs $12n$ are mounted in side by side along the lateral direction of the housing $10a$. The PDs $12n$ of the present embodiment has the type of, what is called, the back illumination where the PDs $12n$ are mounted on the wiring substrate 60 such that the primary surface thereof faces the wiring substrate 60 and optical signals enter the respective PDs $12n$ form the back surfaces thereof. The cathodes and the anodes of the respective PDs $12n$ are provided on the respective primary surfaces facing the wiring substrate 60. Accordingly, the wiring substrate 60 provides the third patterns 67 and interconnections having pads directly connected to the anodes and cathodes of the PDs $12n$, respectively.

The carrier 68 also mounts the TIA 13 thereon behind the wiring substrate 60. The anodes of the PDs $12n$, which are directly connected to the respective interconnections on the wiring substrate 60, and these interconnections are wire-bonded to the respective inputs of the TIA 13 at the rear end of the wiring substrate 60. These arrangements of the PDs $12n$, the positional relation between the wiring substrate 60 and the TIA 13 may shorten the electrical connection between the PDs $12n$ and the TIA 13. Also, ground patterns, on which the second capacitors Cn2 are mounted, are provided between the PDs $12n$ and the interconnections connected to the anodes of the PDs $12n$. Although the ground patterns are connected to each other in the back surface of the wiring substrate 60 but isolated from each other on the top surface $60x$ of the wiring substrate 60, which effectively isolates respective PDs $12n$ or respective signal channels.

The internal bias lines $16n$ are formed on a top surface $60x$ of the wiring substrate 60 on which the PDs $12n$ are also mounted. The internal bias lines $16n$ are connected to the respective terminals $15n$ provided in respective sides of the housing $10a$ of the Rx module 10 by the bonding wires $61n$. The respective resistors Rn are also formed on the top surface $60x$ of the wiring substrate 60. Basic arrangements of the bias lines $16n$ are substantially same. Specifically, the respective inner bias lines $16n$ include the bonding wires $61n$, the first patterns $62n$, the resistors Rn, the second patterns 63, the bonding wires, 64 to 66, and the third pattern 67. The first bonding wires $61n$ connect the respective terminals $15n$ to respective first patterns $62n$. The first patterns $62n$ in respective one ends are wire-bonded by the bonding wires $61n$ to the terminals $15n$, while, the other ends thereof continue to the resistors Rn. The second bonding wires 64 connect the second patterns 63 to the first capacitors Cn1. The third bonding wires 65 connect the second patterns 63 to the second capacitors Cn2, and the fourth bonding wires 66 connect the second capacitors Cn2 to third patterns 67. FIG. 3 only defines the second patterns 63, the bonding wires, 64 to 66, and the third patterns 67 for the second channel, but the first, third, and fourth channels provide the arrangement of those patterns and the bonding wires substantially same with those of the second channel. Also, the first to third patterns for the respective channels are formed on the top surface $60x$ of the wiring substrate 60, and the second capacitors Cn2 are also mounted on the top surface $60x$ of the wiring substrate 60. However, the first capacitors Cn1 are provided outside of the wiring substrate 60.

Comparing the first bias line $16_1$ with the second bias line $16_2$, the first pattern $62_1$ of the first bias line $16_1$ is formed inward with respect to the first pattern $62_2$ of the second bias line $16_2$ such that the first pattern $62_1$ extends along the edge of the carrier 60. Moreover, a length of the first bias line $16_1$ from the terminal $15_1$ to the resistor $R_1$ is shorter than a length of the second bias line $16_2$ from the terminal $15_2$ to the resistor $R_2$. The bonding wires, $61_1$ and $61_2$, have lengths substantially same to each other, accordingly, the first pattern $62_1$ of the first bias line $16_1$ is shorter than the first pattern $62_2$ of the second bias line $16_2$. Also, the second patterns 63, the bonding wires, 64 to 66, and the third patterns 67 have the arrangement substantially same with to each other. The description above concentrates on the arrangement between the first bias line $16_1$ and the second bias line $16_2$, but the situation same with those bias lines, $16_1$ and $16_2$, is reflected in the arrangements between the third bias line $16_3$ and the fourth bias line $16_4$. That is, the arrangement of the patterns and the bonding wires on the wiring substrate 60 is the axial symmetry by the longitudinal axis of the housing $10a$ of the Rx module 10.

Next, advantages of the arrangements in the Rx module 10 will be described. The Rx module 10 of the present embodiment arranges the first external bias line $35_1$ between the signal lines 37 for the Tx module 20 and the second external bias line $35_2$; that is, the first external bias line $35_1$ is set closest to the signal lines 37 for the Tx module 20. Accordingly, the first bias line $35_1$ is most likely to be influenced by noises due to the switching of the large current provided to the LDs $21n$. Accordingly, even when the noises superposed on the first bias line $35_1$ is eliminated by, for instance, RC filters and/or LC filters inserted intermediate of the first bias lines, $16_1$ and $35_1$, the noises may be radiated to the next bias line $35_2$, namely, the second bias lines, $16_2$ and $35_2$, which degrades the degrades the sensitivity of not only the first channel implemented with the first bias lines, $16_1$ and $35_1$, but the second channel implemented with the second bias lines, $16_2$ and $35_2$.

The Rx module 10 of the embodiment, for the subject above described, shortens the first bias line $16_1$ from the first terminal $15_1$ to the resistor $R_1$ through the bonding wire $61_1$ and the first pattern $62_1$ on the wiring substrate 60 relative to the second bias line $16_2$ from the second terminal $15_2$ to the second resistor $R_2$ through the bonding wire $61_2$ and the first pattern $62_2$ on the wiring substrate 60. Thus, the influence, or the EMI radiation, from the first bias line $16_1$ to the second bias line $16_2$ may be reduced.

Second Embodiment

Figure 4:
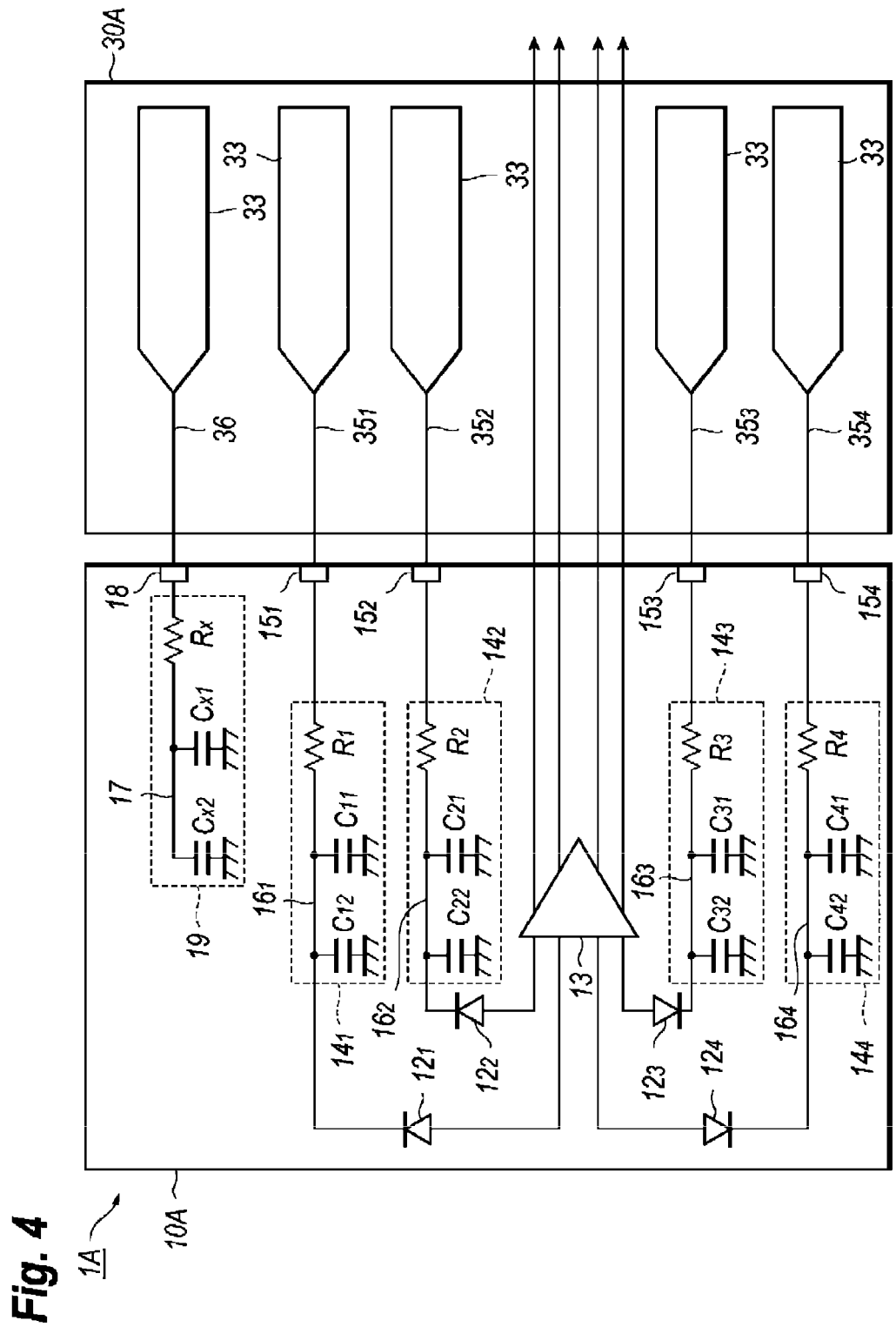
FIG. 4 is a circuit diagram of an optical receiver according to the second embodiment of the present application.

FIG. 4 shows a circuit diagram of an Rx module 10A and the PCB 30A according to the second embodiment of the present application. The Rx module 10A, and the PCB 30A of the second embodiment has a feature that the Rx module 10A provides, in addition to the first to fourth external bias lines 16n for the respective PDs 12n, a dummy unit 19 including an internal dummy line 17, a dummy terminal 18, and the PCB 30A provides an external dummy line 36 which is put between the signal lines 37 for the Tx module 20 and the first bias line $35_1$ in the outside of the Rx module 10A. That is, the external dummy line 36 is arranged between the signal lines 37 for the Tx module 20 and the first external bias line disposed closest to the signal line 37. The first to fourth bias lines 35n are arranged closer to the signal line 37 in this order. Accordingly, the external dummy line 36 is most likely to be influence by the EMI noise due to the switching of large currents in the signal line 37, and the first to fourth bias lines 35n are likely affected by the EMI noises in this order.

The Rx module 10A shown in FIG. 4 provides, in addition to the filter units 14n, the terminals 15n, the internal bias lines 16n, an internal dummy line 17, another terminal 18, and another filter unit 19. The internal dummy line 17 continues to the external dummy line 36 through the other terminal 18, but is floated within the Rx module 10A. That is, the internal dummy line 17 is connected nowhere in the Rx module 10A.

The filter unit 19 in the internal dummy line 17 also provides two capacitors, Cx1 and Cx2, and a resistor Rx, which is substantially identical with those in the other filter units 14n. That is the capacitance of the respective capacitors, Cx1 and Cx2, and the resistance of the resistor Rx is same with those in the other filter units 14n. The resistor Rx and the first capacitor Cx1 sets the cut-off frequency from several mega-hertz to several scores of mega-hertz, while, the second capacitor Cx2 and the resistor Rx determines the cut-off frequency such that the noises corresponding to the signal frequency of 100 Gbps may be effectively eliminated. The capacitance of the second capacitor Cx2 may be set to be several pico-farads to several hundreds of pico-farads.

Because the external dummy line 36 is most likely affected by the EMI noise caused by switching a large current in the signal line 37; the Rx module of the present embodiment shorten a length of the internal dummy line 17 from the terminal 18 to the resistor Rx in the housing 10a compared with the other bias lines 16n from the respective terminals 15n to the resistors Rn. Next, an arrangement around the PDs 12n in the Rx module 10A will be described as referring to FIG. 5, which specifically illustrates the arrangement in the Rx module 10A.

Figure 5:
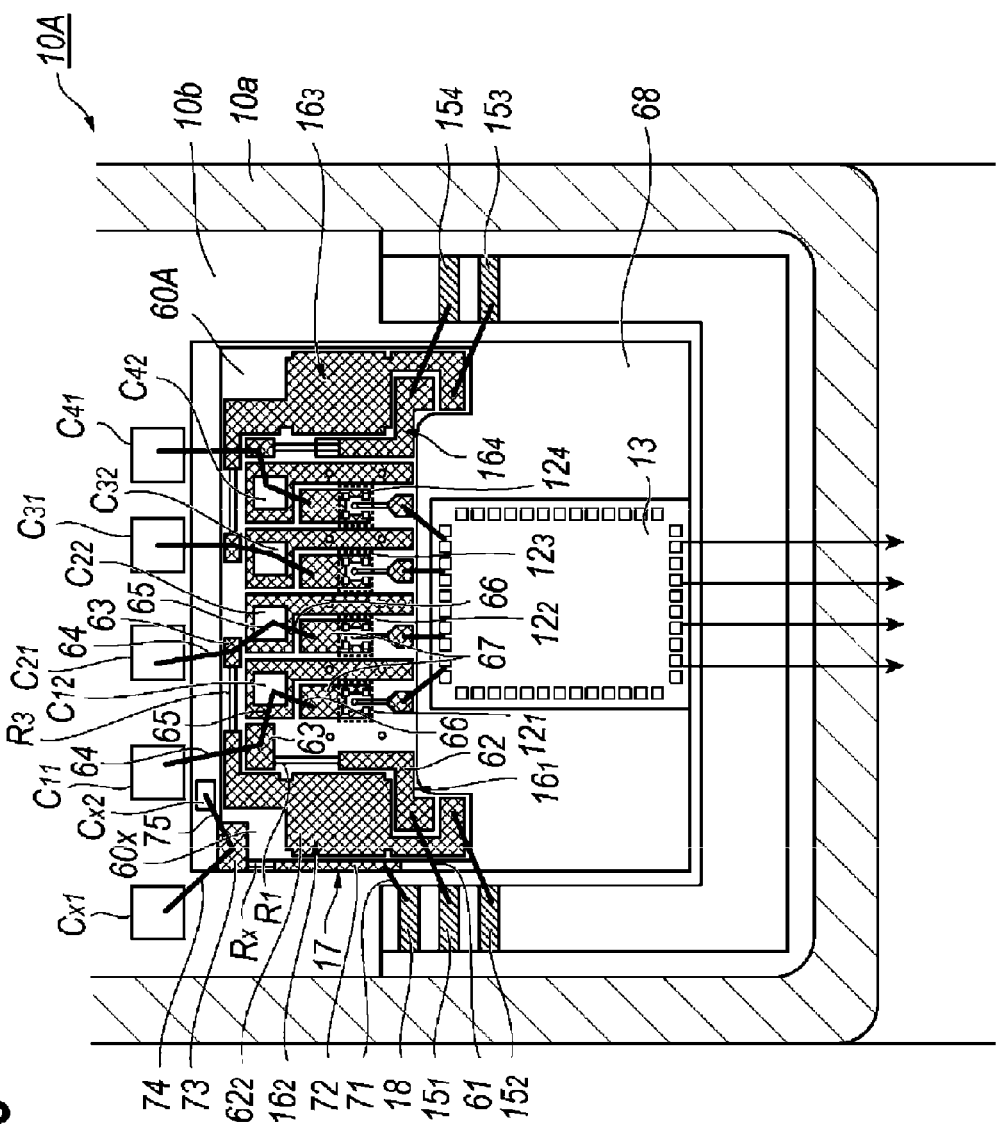
FIG. 5 is a plan view of the receiver module whose circuit diagram is shown in FIG. 5.

As illustrated in FIG. 5, the internal bias lines 16n including the internal dummy line 17, each comprising of the bonding wires, 61 and 71; the first patterns, 62 and 72; the resistors, Rn and Rx; the second patterns, 63 and 73; the bonding wires, 64 and 74, that connect the second patterns, 63 and 73; to the first capacitors, Cn1 and Cx1; the bonding wires, 65 and 75, that connect the second patterns, 63 and 73, to the second capacitors, Cn2 and Cx2. In addition, the internal bias lines 16n further includes the bonding wires 66 connecting the second capacitors Cn2 to the third patterns 67 same with those of the aforementioned embodiment. The first to third patterns, 62, 63, and 67, are formed on the wiring substrate 60A. Other arrangements except for the internal dummy line 17 are same with those of the first embodiment.

The dummy bias line 17, as described above, includes the dummy terminal 18, the bonding wires, 71, 74, and 75, the first and second patterns, 72 and 73, where they are arranged along edge of the wiring substrate 60A. Comparing the arrangement around the internal dummy line 17 with those of the first to fourth bias lines 16n, the first pattern 72 is provided on the wiring substrate 60 in an outer side of the first pattern $62_2$ in the second bias line $16_2$, which may shorten the bonding wire 71 with respect to the bonding wire 61 of the second bias line $16_2$. Moreover, the first pattern 72 of the internal dummy line 17 has a length shorter than a length of the second pattern $62_2$ of the second bias line $16_2$. Accordingly, the internal dummy line 17 has a length from the dummy terminal 18 to the resistor Rx shorter than a length of the second bias line $16_2$ from the terminal $15_2$ to the resistor $R_2$.

Advantages of the Rx module 10A of the second embodiment will be described. The optical transceiver 1A of the second embodiment provides the external dummy line 36 from the bias supply 33 on the PCB 30A to the Rx module 10A. The external dummy line 36, which is connected to the internal dummy line 17 in the Rx module 10A, is put between the signal line 37 for the Tx module 20 and the external bias lines 35n, namely, arranged closest to the signal line 37. Accordingly, the external dummy line 36 is most likely influenced by the EMI noises caused by the signal line 37.

The internal dummy line 17 in the Rx module 10A, which is connected to the external dummy line 36, is floated in the Rx module 10A, that is, the internal dummy line 17 is connected nowhere in the Rx module 10A but terminated by the filter unit 19 including the capacitors, Cx1 and Cx2, and the resistor Rx, which is similar to the internal bias lines 16n. Thus, the external and internal dummy lines, 36 and 17, may effectively shield the internal bias lines 16n from the signal line 37 for the Tx module 20.

Moreover, the length of the internal dummy line 17 from the terminal 18 to the resistor Rx through the bonding wire 71 and the first pattern 72 is shorter than the length of the second bias line $16_2$ from the terminal $15_2$ to the resistor $R_2$ through the bonding wire 61 and the first pattern 62. That is, a section at which the crosstalk between the internal dummy line 17 and the second bias line $16_2$ may be shortened and reduce the EMI noises transmitted from the internal dummy line 17 to the second bias line $16_2$. The degradation in the sensitivity of the Rx module 10A may be suppressed.

Although the present invention has been fully described in conjunction with the embodiments thereof with reference to the accompanying drawings, it is to be understood that various changes and modifications may be apparent to those skilled in the art. For example, the embodiments arrange the bias lines, $16_1$ to $16_4$, in axial symmetry with respect to the longitudinal axis of the housing 10a. However, only the first internal bias line $16_1$ connected to the external bias line $35_1$, which positions closest to the signal line 37 for the Tx module 20, may be set to be shorter from the terminal $15_1$ to the resistor $R_1$ than the other bias lines, $16_2$ to $16_4$.

Figure 6:
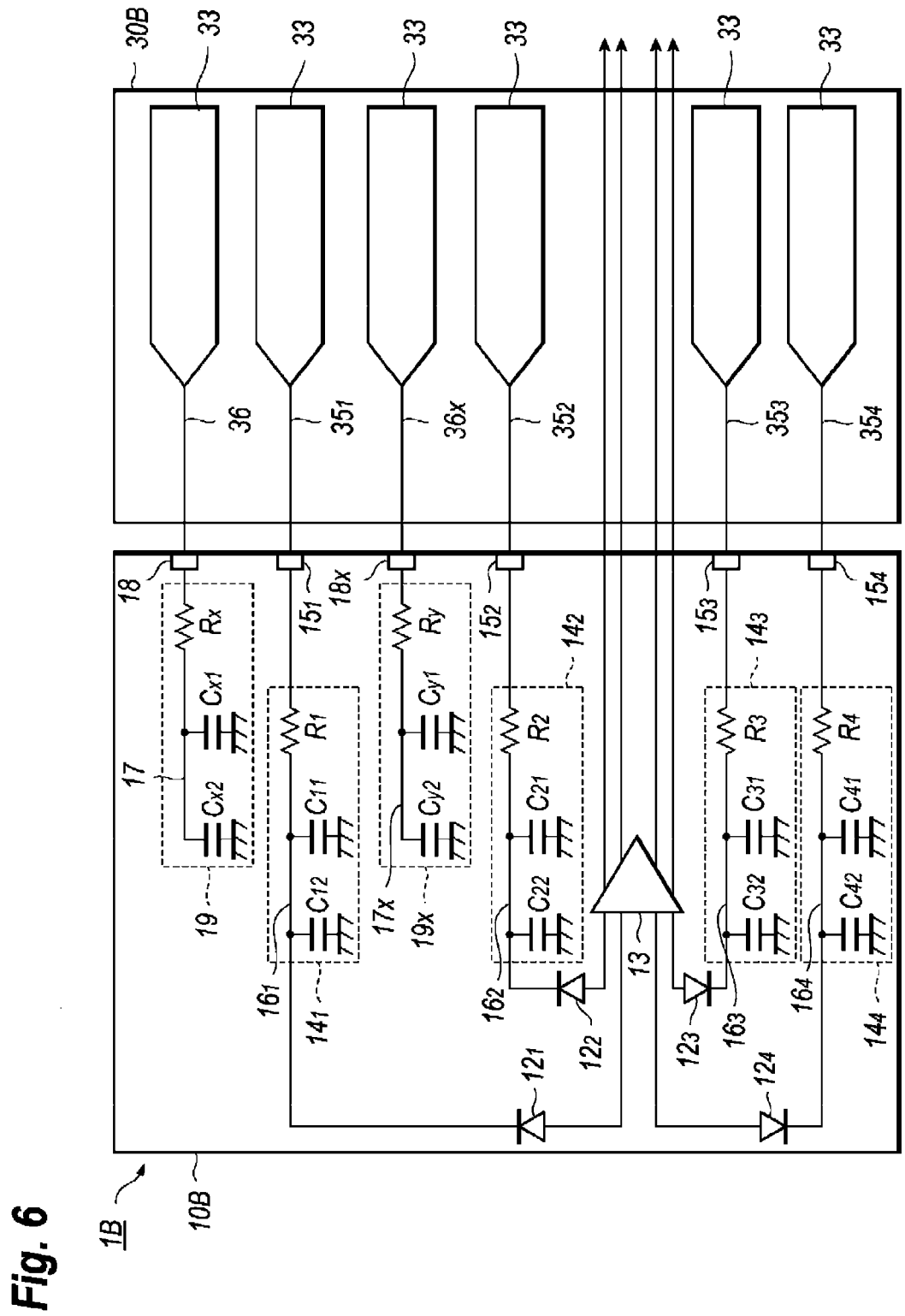
FIG. 6 is a circuit diagram of an optical receiver modified from that shown in FIGS. 5 and 6.

Also, the PCB 30A may further provide another dummy line 36x between the external first bias lines $35_1$ and the external second bias line $35_2$, as shown in FIG. 6. The other dummy line 36x is connected to the other inner dummy line 17x terminated by the filter unit 19x including two capacitors, C1y and C2y, and a resistor Ry within the Rx module 10B. That is, the other internal dummy line 17y is connected nowhere in the Rx module 10B same as those of the aforementioned internal dummy line 17. The filter unit 17x of the other internal dummy line 17y has the same characteristic with those of the filter unit 19 in the internal dummy line 17 and those of the filter units 14n of the internal bias lines 16n. Moreover, the length of the other internal dummy line 17y from the terminal 18x to the resistor Ry is set to be shorter than the lengths of the bias lines 16n from the terminals 15n to the resistors Rn.

Thus, the external dummy line 36 may effectively shield the external bias lines 35n from the signal line 37 for the Tx module 20 because the external dummy line 36 arranged between the signal line 37 and the first bias line $35_1$ has low impedance. Moreover, because the other external dummy line 36x is arranged between the first and second external bias lines, $35_1$ and $35_2$; the other bias line 36x may further shield the second to fourth external bias lines, $35_2$ to $35_4$, from the signal line 37. Also, because the first internal bias line $16_1$ connected to the external first bias line $35_1$ has the shortest length from the terminal $15_1$ to the resistor $R_1$ compared with the lengths of the other internal bias lines, $16_2$ to $16_4$, within the housing 10a of the Rx module 10; the EMI noise affected to the first external bias line $35_1$ from the signal line 37 may be suppressed from affecting the second to fourth bias lines, $16_2$ to $16_4$.

Also, the embodiment concentrates the arrangement of the optical transceiver 1 implementing with four signal channels. However, the spirit of the present invention may be applicable to an optical transceiver implementing with at least two channels. Similarly, the number of the bias lines and the filter units are not restricted to four, the Rx module implements with the bias lines and the filter units in the number thereof equal to the number of the channels. Also, the PDs 12n may be a type of avalanche photodiode (APD) to be supplied with larger biases. Such changes and modifications are to be understood as included within the scope of the present invention as defined by the appended claims, unless they depart therefrom.

We claim:

1. An optical transceiver that transmits a wavelength multiplexed optical signal and receives another wavelength multiplexed optical signal, the optical transceiver comprising:
   an optical transmitter module configured to receive driving signals through signal lines, convert the driving signals into transmitting optical signals having respective wavelengths different from each other, and generate the wavelength multiplexed optical signal by multiplexing the transmitting optical signals depending on the wavelengths thereof;
   an optical receiver module configured to de-multiplex the another wavelength multiplexed signal into receiving optical signals, and convert the receiving optical signals into receiving signals by photodiodes (PDs);
   a bias supply configured to supply biases to respective PDs through external bias lines including first external bias line and other external bias lines, the first external bias line being arranged closest to the signal lines that carry the driving signals to the optical transmitter module,
   wherein the optical receiver module includes a wiring substrate, terminals, and internal bias lines connected to the external bias lines through the terminals, the internal bias lines including bonding wires having substantially even lengths, first patterns, second patterns, third patterns, and filter units, the first and second patterns being provided on the wiring substrate, the first patterns being connected to the terminals through the bonding wires, the filter units being provided between the first patterns and the second patterns, the second pattern being connected to the PDs, the filter units including resistors and capacitors constituting RC filters, the resistors connected between the first patterns and the second patterns, the capacitors being providing between the second patterns and ground patterns provided on the wiring substrate, the PDs being mounted on the third patterns and connected to the second pattern through bonding wires, the filter units providing first capacitors and second capacitors, the first capacitors being mounted outside of the wiring substrate and connected to the second patterns through bonding wires, the second capacitors being mounted on the ground patterns on the wiring substrate and connected to the second patterns through bonding wires, and
   wherein one of the first internal bias lines connected to the first external bias line has the first pattern shortest in a length thereof compared with the other first patterns involved in the other internal bias lines.

2. The optical transceiver of claim 1,
   wherein the resistor are film resistors formed on the wiring substrate.

3. The optical transceiver of claim 1,
   wherein the second capacitors have capacitance smaller than capacitance of the first capacitors mounted outside of the wiring substrate.

4. The optical transceiver of claim 1, wherein the bonding wires connecting the second patterns to the second capacitors mounted on the wiring substrate has lengths substantially equal to each other.

5. The optical transceiver of claim 1,
   further including a carrier that mounts the wiring substrate thereon,
   wherein the carrier further mounts trans-impedance amplifiers thereon each connected to the respective PDs.

6. The optical transceiver of claim 5,
   wherein the trans-impedance amplifiers are connected to the respective PDs through bonding wires.

7. The optical transceiver of claim 1,
   further including an external dummy line disposed between the signal lines and the first external bias line in an outside of the optical receiver module, and an internal dummy line in an inside of the optical receiver module,
   wherein the internal dummy line provides an auxiliary terminal, a bonding wire, a first pattern connected to the another auxiliary terminal through the bonding wire thereof, a resistor, a second pattern, and a capacitor; the first pattern, the resistor, and the second pattern of the internal dummy line being provided on the wiring substrate, the capacitor of the internal dummy line being mounted on an outside of the wiring substrate, the auxiliary terminal connecting the external dummy line to the internal dummy line, and
   wherein the bonding wire and the first pattern of the internal dummy line have a total length shorter than the lengths of the inner bias lines.

8. The optical transceiver of claim 7,
   further including another external dummy line disposed between the first external bias line and one of the other external bias lines closest to the first external bias line in the outside of the optical receiver module, and another internal dummy line in the inside of the optical receiver module, wherein the another internal dummy line includes another auxiliary terminal, a bonding wire, a first pattern connected to the another auxiliary terminal of the another internal dummy line with the bonding wire thereof, a resistor, a second pattern, and a capacitor; the first pattern, the resistor, and the second pattern of the another internal dummy line being provided on the wiring substrate; the capacitor of the another internal dummy line being mounted on the outside of the wiring substrate; the another auxiliary terminal of the another internal dummy line connecting the another external dummy line to the another internal dummy line, and wherein the another internal dummy line have a total length of the bonding wire and the first pattern thereof that is shorter than the total lengths of the inner bias lines.

9. An optical transceiver that transmits a wavelength multiplexed optical signal and receives another wavelength multiplexed optical signal, the optical transceiver comprising:

an optical transmitter module configured to receive driving signals through signal lines, convert the driving signals into transmitting optical signals having respective wavelengths different from each other, and generate the wavelength multiplexed optical signal by multiplexing the transmitting optical signals depending on the wavelengths thereof;

an optical receiver module configured to de-multiplex the another wavelength multiplexed signal into receiving optical signals, and convert the receiving optical signals into receiving signals by photodiodes (PDs);

a bias supply configured to supply biases to respective PDs through external bias lines including first external bias line and other external bias lines, the first external bias line being arranged closest to the signal lines carrying the driving signals to the optical transmitter module; and an external dummy line disposed between the signal lines and the first external bias line in an outside of the optical receiver module, wherein the optical receiver module includes a wiring substrate, terminals, internal bias lines connected to the external bias lines through the terminals, an internal dummy line in an inside of the optical receiver module, and an auxiliary terminal, the internal bias lines including bonding wires having substantially even lengths, first patterns, second patterns, and filter units, the first and second patterns being provided on the wiring substrate, the first patterns being connected to the terminals through the bonding wires, the filter units being provided between the first patterns and the second patterns, the filter units including resistors and capacitors constituting RC filters, the resistors connected between the first patterns and the second patterns, the capacitors being connected to the second patterns, the internal dummy line being connected to the external dummy line through the auxiliary terminal, wherein one of the first internal bias lines connected to the first external bias line has the first pattern shortest in a length thereof compared with the other first patterns involved in the other internal bias lines, wherein the internal dummy line provides a bonding wire, a first pattern connected to the auxiliary terminal through the bonding wire, a resistor, a second pattern, and a capacitor, the first pattern, the resistor and the second pattern of the internal dummy line being provided on the wiring substrate, the capacitor of the internal dummy line being mounted on an outside of the wiring substrate, and wherein the internal dummy line have a total length of the bonding wire and the first pattern thereof that is shorter than the total lengths of the inner bias lines.

10. The optical transceiver of claim 9, further including another external dummy line disposed between the first external bias line and one of the other external bias lines closest to the first external bias line in the outside of the optical receiver module, and another internal dummy line in the inside of the optical receiver module, wherein the another internal dummy line includes another auxiliary terminal, a bonding wire, a first pattern connected to the another auxiliary terminal of the another internal dummy line with the bonding wire thereof, a resistor, a second pattern, and a capacitor; the first pattern, the resistor, and the second pattern of the another internal dummy line being provided on the wiring substrate; the capacitor of the another internal dummy line being mounted on the outside of the wiring substrate; the another auxiliary terminal of the another internal dummy line connecting the another external dummy line to the another internal dummy line, and wherein the another internal dummy line have a total length of the bonding wire and the first pattern thereof that is shorter than the total lengths of the inner bias lines.

* * * * *